United States Patent
Tseng et al.

(10) Patent No.: US 8,829,877 B2
(45) Date of Patent: Sep. 9, 2014

(54) RESONANCE FREQUENCY ADJUSTING CIRCUIT

(75) Inventors: Chuang-Wei Tseng, New Taipei (TW); Kai-Fu Chen, New Taipei (TW); Chia-Yun Lee, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 215 days.

(21) Appl. No.: 13/332,384

(22) Filed: Dec. 21, 2011

(65) Prior Publication Data

US 2013/0106376 A1     May 2, 2013

(30) Foreign Application Priority Data

Oct. 26, 2011    (TW) ............................. 100138852 A

(51) Int. Cl.
| | |
|---|---|
| G05F 1/00 | (2006.01) |
| H01H 47/20 | (2006.01) |
| H01H 83/00 | (2006.01) |
| H02H 3/00 | (2006.01) |
| H02M 1/12 | (2006.01) |
| H02M 1/00 | (2006.01) |
| H03H 7/01 | (2006.01) |

(52) U.S. Cl.
CPC ........ *H02M 1/12* (2013.01); *H02M 2001/0012* (2013.01); *H03H 7/0115* (2013.01)

USPC ............ 323/284; 307/129; 323/283; 363/124

(58) Field of Classification Search
USPC .......... 307/129; 323/241–243, 270, 271, 274, 323/275, 282–285; 327/40–49; 332/118; 363/124
See application file for complete search history.

(56) References Cited

U.S. PATENT DOCUMENTS

| | | | | |
|---|---|---|---|---|
| 5,063,490 | A | * | 11/1991 | Maehara et al. ................. 363/37 |
| 5,072,355 | A | * | 12/1991 | Huillet ............................ 363/89 |
| 2002/0001211 | A1 | * | 1/2002 | Huggett et al. ............... 363/124 |
| 2002/0030474 | A1 | * | 3/2002 | Sakiyama et al. ............ 323/288 |
| 2009/0284879 | A1 | * | 11/2009 | Critchley ........................ 361/43 |

* cited by examiner

*Primary Examiner* — Adolf Berhane
*Assistant Examiner* — Gary Nash
(74) *Attorney, Agent, or Firm* — Novak Druce Connolly Bove + Quigg LLP

(57) ABSTRACT

A resonance frequency adjusting circuit in electronic communication with a power supply and a load connected to the power supply includes a first LC filter, a capacitor, a switch, and a frequency detecting and control module. The first LC filter circuit is electrically connected between the power supply and the load. The switch is electrically connected between the capacitor and ground. The frequency detecting and control module detects a current transient frequency of the load, compares the current transient frequency with a first resonance frequency of the first LC filter circuit, and controls the switch to turn on/off according to the comparison.

18 Claims, 1 Drawing Sheet

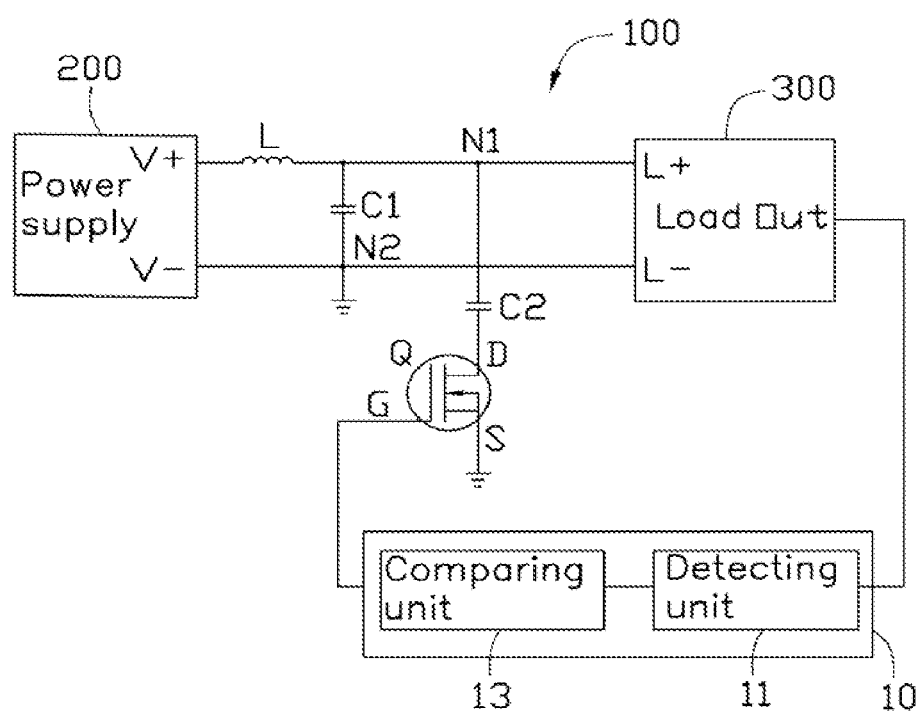

RESONANCE FREQUENCY ADJUSTING CIRCUIT

BACKGROUND

1. Technical Field

The disclosure generally relates to resonance frequency adjusting circuits, and particularly to a resonance frequency adjusting circuit for a power supply.

2. Description of Related Art

For a power supply circuit, a LC filter circuit is commonly connected between a power supply and a load to filter an alternative current portion of the power supply. However, a current transient frequency of the load is usually variable and may be equal to a resonance frequency of the LC filter circuit. When the current transient frequency is equal to the resonance frequency, a resonating phenomenon occurs, which may lead to an unstable voltage output of the power supply.

Therefore, there is room for improvement within the art.

BRIEF DESCRIPTION OF THE DRAWING

Many aspects of the present disclosure can be better understood with reference to the following drawing. The components in the drawing are not necessarily drawn to scale, the emphasis instead being placed upon clearly illustrating the principles of the disclosure.

The FIGURE is a circuit diagram of a resonance frequency adjusting circuit connected between a power supply and a load, according to an exemplary embodiment of the disclosure.

DETAILED DESCRIPTION

The FIGURE is a circuit diagram of a resonance frequency adjusting circuit 100 connected between a power supply 200 and a load 300, according to an exemplary embodiment of the disclosure. The power supply 200 is a direct current (DC) power supply, which includes a first output terminal V+ and a second output terminal V−. The load 300 may be a CPU. The load 300 has a first terminal L+ electrically connected to the first output terminal V+ and a second terminal L− electrically connected to the second output terminal V− to obtain a working voltage from the power supply 200.

The resonance frequency adjusting circuit 100 includes an inductor L, a first capacitor C1, a second capacitor C2, a transistor Q, and a frequency detecting and control module 10.

The inductor L and the first capacitor C1 cooperatively form a first LC filter circuit connected between the power supply 200 and the load 300. The inductor L is electrically connected between the first output terminal V+ and the first terminal L+ of the load 300. One end of the first capacitor C1 is electrically connected to a node N1 between the inductor L and the load 200. Another end of the first capacitor C1 is electrically connected to a node N2 between the second output terminal V− of the power supply and the second terminal L− of the load, and is grounded. A resonance frequency f1 of the first LC filter circuit satisfies a first formula:

$$f_1 = \frac{1}{2\pi\sqrt{LC_1}}.$$

One end of the second capacitor C2 is electrically connected to the node N1 between the inductor L and the first capacitor C1. Another end of the second capacitor C2 is electrically connected to the transistor Q.

In this embodiment, the transistor Q is a metal-oxide-semiconductor field effect transistor (MOSFET). A drain D of the transistor Q is electrically connected to the second capacitor C2. A gate G of the transistor Q is electrically connected to the frequency detecting and control module 10. A source of the transistor Q is grounded. In other embodiments, the transistor Q may be another type of switch, such as a relay.

The frequency detecting and control module 10 includes a detecting unit 11 and a comparing unit 13 electrically connected to the detecting unit 11.

The detecting unit 11 is electrically connectd to an output terminal Out of the load 300. The detecting unit 11 obtians a current transient frequency F of the load 300 and sends the current transient frequency F to the comparing unit 13. In this embodiment, the detecting unit 11 may be an integrated circuit (IC) which obtains the current transient frequency F by calculating a current period of the load 300. The detecting unit 11 may also be a calculous circuit such as a phase comparator which obtains the current transient frequency F by comparing current phase of the load with a reference phase.

The first resonance frequency f1 of the first LC filter circuit is stored in the comparing unit 13. The comparing unit 13 compares the current transient frequency F with the first resonance frequency f1 and outputs a control signal to the gate of the transistor Q according to the comparison. If the current transient frequency F is equal to the first resonance frequency f1, the comparing unit 13 outputs a high level voltage signal (i.e. logic 1)as the control signal to the transistor Q. If the current transient frequency F is not equal to the first resonance frequency f1, the comparing unit 13 outputs a low level voltage (i.e. logic 0) signal as the control signal to the transistor Q.

When the current transient frequency F is equal to the first resonance frequency f1, namely, the first LC filter circuit can resonate with the load 300, the high level voltage signal is input into the gate G to turn on the transistor Q. Thus, the second capacitor C2 is grounded and is electrically connected to the first capacitor C1 in parallel. The inductor L, the first capacitor C1 and the second capacitor C2 cooperatively form a second LC filter circuit. A second resonance frequency of the second LC filter circuit satisfies a second formula:

$$f_2 = \frac{1}{2\pi\sqrt{L(C_1 + C_2)}}.$$

The second resonance frequency f2 is not equal to the current transient frequency F, and thus the load 300 and the first LC filter circuit cannot resonate. Thus, the power supply 200 maintains to output a stable voltage to the load 300.

When the current transient frequency F is not equal to the first resonance frequency f1, namely, the first LC filter circuit cannot resonate with the load 300 and has no influence on the power supply 200, the low level voltage signal is input to the gate G to turn off the transistor Q. The second capacitor C2 is electrically disconnected from the first capacitor C1.

The resonance frequency adjusting circuit 100 compares the first resonance frequency f1 of the first LC filter circuit with the current transient frequency F of the load 300. When the first resonance frequency f1 is equal to the current transient frequency F, the second capacitor C2 is applied to the first LC filter circuit to generate the second resonance frequency f2 and thereby preventing a resonating phenomenon of the load 300 and the LC filter circuit.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A resonance frequency adjusting circuit in electronic communication with a power supply and a load, wherein the power supply comprises a first output terminal and a second output terminal respectively connected to a first terminal and a second terminal of the load, the resonance frequency adjusting circuit comprising:
a first inductor electrically connected between the first output terminal and the first terminal of the load;
a first capacitor electrically connected between a node between the inductor and the load, and a node between the second output terminal of power supply and the second terminal of the load, the first capacitor being grounded;
a second capacitor, one end of the second capacitor electrically connected to a node between the inductor and the first capacitor;
a switch connected between another end of the second capacitor and ground; and
a frequency detecting and control module, the frequency detecting and control module detecting a current transient frequency of the load, and comparing the current transient frequency with a first resonance frequency of the first inductor and the first capacitor, and controlling the switch to turn on/off according to the comparison.

2. The resonance frequency adjusting circuit of claim 1, wherein when the current transient frequency is equal to the first resonance frequency, the frequency detecting and control module controls the switch to turn on.

3. The resonance frequency adjusting circuit of claim 1, wherein when the current transient frequency is not equal to the first resonance frequency, the frequency detecting and control module controls the switch to turn off.

4. The resonance frequency adjusting circuit of claim 1, wherein the frequency detecting and control module includes a detecting unit and a comparing unit electrically connected to the detecting unit, the detecting unit is electrically connected to the load, the comparing unit is electrically connected to the switch.

5. The resonance frequency adjusting circuit of claim 4, wherein the detecting unit is an integrated circuit which obtains the current transient frequency by calculating a current period of the load.

6. The resonance frequency adjusting circuit of claim 4, wherein the detecting unit is a phase comparator which obtains the current transient frequency by comparing current phase of the load with a reference phase.

7. The resonance frequency adjusting circuit of claim 1, wherein the switch is a metal-oxide-semiconductor field effect transistor (MOSFET), a drain of the MOSFET is electrically connected to the second capacitor; a gate of the MOSFET is electrically connected to the frequency detecting and control module; a source of the MOSFET is grounded.

8. A resonance frequency adjusting circuit in electronic communication with a power supply and a load connected to the power supply, the resonance frequency adjusting circuit comprising:
a first LC filter circuit being electrically connected between the power supply and the load;
a capacitor;
a switch electrically connected between the capacitor and ground; and
a frequency detecting and control module, the frequency detecting and control module detecting a current transient frequency of the load, comparing the current transient frequency with a first resonance frequency of the first LC filter circuit, and controlling the switch to turn on/off according to the comparison; wherein when the current transient frequency is equal to the first resonance frequency, the frequency detecting and control module controls the switch to turn on, the capacitor and the first LC filter circuit form a second LC filter circuit.

9. The resonance frequency adjusting circuit of claim 8, wherein when the current transient frequency is not equal to the first resonance frequency, the frequency detecting and control module controls the switch to turn off.

10. The resonance frequency adjusting circuit of claim 8, wherein the frequency detecting and control module includes a detecting unit and a comparing unit electrically connected to the detecting unit, the detecting unit is electrically connected to the load, the comparing unit is electrically connected to the switch.

11. The resonance frequency adjusting circuit of claim 10, wherein the detecting unit is an integrated circuit which obtains the current transient frequency by calculating a current period of the load.

12. The resonance frequency adjusting circuit of claim 10, wherein the detecting unit is a phase comparator which obtains the current transient frequency by comparing current phase of the load with a reference phase.

13. The resonance frequency adjusting circuit of claim 8, wherein the switch is a metal-oxide-semiconductor field effect transistor (MOSFET), a drain of the MOSFET is electrically connected to the capacitor; a gate of the MOSFET is electrically connected to the frequency detecting and control module; a source of the MOSFET is grounded.

14. A resonance frequency adjusting circuit in electronic communication with a power supply and a load connected to the power supply, the resonance frequency adjusting circuit comprising:
a first LC filter circuit being electrically connected between the power supply and the load;
a capacitor;
a switch electrically connected between the capacitor and ground; and
a frequency detecting and control module, the frequency detecting and control module detecting a current transient frequency of the load, comparing the current transient frequency with a first resonance frequency of the first LC filter circuit, and controlling the switch to turn on/off according to the comparison; wherein the frequency detecting and control module includes a detecting unit and a comparing unit electrically connected to the detecting unit, the detecting unit is electrically connected to the load, the comparing unit is electrically connected to the switch.

15. The resonance frequency adjusting circuit of claim 14, wherein when the current transient frequency is not equal to the first resonance frequency, the frequency detecting and control module controls the switch to turn off.

16. The resonance frequency adjusting circuit of claim 14, wherein the detecting unit is an integrated circuit which obtains the current transient frequency by calculating a current period of the load.

17. The resonance frequency adjusting circuit of claim 14, wherein the detecting unit is a phase comparator which obtains the current transient frequency by comparing current phase of the load with a reference phase.

18. The resonance frequency adjusting circuit of claim 14, wherein the switch is a metal-oxide-semiconductor field effect transistor (MOSFET), a drain of the MOSFET is electrically connected to the capacitor; a gate of the MOSFET is electrically connected to the frequency detecting and control module; a source of the MOSFET is grounded.

* * * * *